US006865097B2

(12) United States Patent
Regev

(10) Patent No.: US 6,865,097 B2
(45) Date of Patent: Mar. 8, 2005

(54) PRIORITY ENCODER

(75) Inventor: Zvi Regev, West Hill, CA (US)

(73) Assignee: Micron Technology, Inc., Boise, ID (US)

( * ) Notice: Subject to any disclaimer, the term of this patent is extended or adjusted under 35 U.S.C. 154(b) by 172 days.

(21) Appl. No.: 10/188,971

(22) Filed: Jul. 5, 2002

(65) Prior Publication Data

US 2003/0016575 A1 Jan. 23, 2003

Related U.S. Application Data

(60) Provisional application No. 60/303,222, filed on Jul. 6, 2001.

(51) Int. Cl.[7] ................................................ G11C 15/00
(52) U.S. Cl. ..................................... 365/49; 365/189.07
(58) Field of Search ............................... 365/49, 189.07

(56) References Cited

U.S. PATENT DOCUMENTS 5,394,353 A * 2/1995 Nusinov et al. .............. 365/49
5,852,569 A * 12/1998 Srinivasan et al. ........... 365/49
5,973,950 A * 10/1999 Shindo ........................ 365/49
6,505,271 B1 * 1/2003 Lien et al. .................. 711/108

* cited by examiner

*Primary Examiner*—Richard Elms
*Assistant Examiner*—Pho M. Luu
(74) *Attorney, Agent, or Firm*—Dickstein Shapiro Morin & Oshinsky LLP

(57) ABSTRACT

A priority encoder for a content addressable memory (CAM) includes a thermometer circuit in which the priority of multiple data inputs is determined at the transistor level. Matching outputs from a CAM are fed to the priority encoder. The priority encoder is divided into a number of segments. A signal indicating a match in a higher priority segment causes lower priority segments to be disabled. Matching inputs are prioritized by way of a parallel arrangement of transistors coupled to NOR gates. The logic incorporated into the transistor arrangement prioritizes the matching inputs such that only the input having the highest priority is forwarded to an address table for decoding the address of the highest priority match.

24 Claims, 13 Drawing Sheets

200
VDD
R1
R2
R3
R4
R5
BC0
BC1
BC2
BC3
EC3
238
BT0
BT1
BT2
BB2
BB1
BB0
HW TABLE 3
EC2
228
BT3
BB3
HW TABLE 2
P0
P1
P2
P3
P4
P5
P6
P7
TS3
236
BOTEXP
PO0
PO1
PO2
PO3
PO4
PO5
PO6
PO7
PI_N0
PI_N1
PI_N2
PI_N3
PI_N4
PI_N5
PI_N6
PI_N7
ENABLE_N
THERMOMETER SEGMENT
TS2
226
PL N24
PL N25
PL N26
PL N27
PL N28
PL N29
PL N30
PL N31
PL N16
PL N17
PL N18
PL N19
PL N20
PL N21
PL N22
PL N23
G1
232
G2
233
G3
234
G4
235
G5
222
G6
223
G7
224
G8
225

PRIORITY ENCODER

DOMESTIC PRIORITY CLAIM

The present application claims the benefit of U.S. provisional application Ser. No. 60/303,222 filed Jul. 6, 2001, the contents of which are incorporated herein by reference.

BACKGROUND

Field of the Invention

The present invention relates to a priority encoder useful in content addressable memory systems.

Priority encoders are electronic logic circuits that determine which of a number of inputs has the highest or lowest priority. Priority encoders are used in a number of computer systems, as well as other applications. Priority encoders can be utilized in conjunction with Content Addressable Memory (CAM), for example.

CAM can be used to perform fast address searches. For example, Internet routers often include a CAM for searching an address containing specified data. Thus, CAMs allow routers to perform high speed address searches to facilitate more efficient communication between computer systems over computer networks. Besides routers, CAMs are also utilized in such areas as databases, network adapters, image processing, voice recognition applications, and others.

In contrast to random access memory (RAM), which returns data in response to requests, CAM returns address locations. In a typical application, a CAM memory array generates a match signal on a match line which may be provided to a priority encoder so that an address corresponding to the highest priority match can be determined for the data being searched. As but one example, a priority encoder can determine the highest priority match from among 128K match inputs. Consequently, priority encoder size and speed of operation are particularly crucial when used in CAM applications.

Priority encoders often operate like a "thermometer" in determining which of the match results has the highest priority. A conventional thermometer priority encoder is shown in FIG. 1 in which match inputs from respective match lines are applied to terminals P_N0 through P_N4, or higher. The match line that indicates a match on inputs P_N0 . . . P_N4 which has the highest priority will cause the lowest output terminal T0 . . . T4 to change states indicating a match. As shown in FIG. 1, thermometer priority encoder 2 utilizes an arrangement of logic gates to determine which of the inputs has the highest priority.

Since CAMs are becoming more powerful in their ability to perform large searches more rapidly, each search can generate many search results which then need to be quickly processed through a priority encoder to ascertain the match with the highest priority.

This requires an increased complexity and size of the logic circuit of the priority encoder, accompanied by a reduction in its encoding speed. In addition, power consumption necessarily increases as the size of the priority encoder increases. The increased power consumption is generally due to the fact that the priority encoder requires all of the logic blocks in different stages to turn ON, even when only one block in a given stage is actually contributing to the priority encoding process.

A low power smaller size priority encoder which can provide increased operational speed is needed.

SUMMARY OF THE INVENTION

The present invention provides a priority encoder which accomplishes thermometer like priority encoding at the transistor gate level, instead of at a higher order logic gate level. The encoder utilizes a design which divides the encoder into smaller segments, and incorporates a look ahead capability. The present invention can be produced in small sizes, and operates at faster speeds than other priority encoder circuits.

In an exemplary arrangement, a 32 input priority encoder is divided into four segments, each having eight inputs. Each segment has a stack of eight gate elements, for example. Each gate element includes a NOR gate coupled to a linking pair of P and N channel transistors. A priority match in any particular segment is indicated by a high signal output from a NOR gate which is coupled to an input of the segment indicating a highest priority match.

The segments are arranged from highest priority to lowest priority. Once a match is found in a higher priority segment, operation of all lower priority segments is disabled by a look ahead function using an activity detector circuit. When the activity detector circuit determines that a match exists in a higher priority segment, a signal is provided directly as input to all lower priority segments, thereby disabling operation of the lower priority segments.

These and other features and advantages of the invention will be more clearly understood from the following detailed description which is provided in connection with the accompanying drawings.

DETAILED DESCRIPTION

Figure 1:
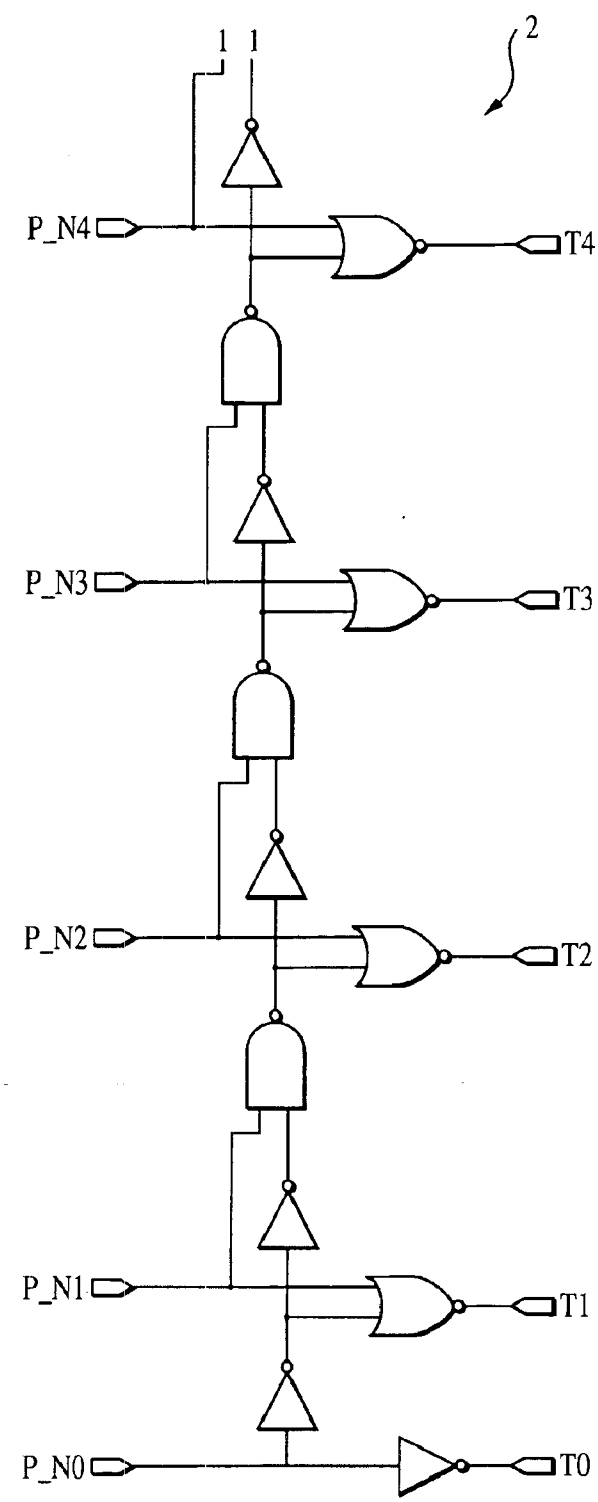
FIG. 1 is a circuit diagram of a conventional thermometer priority encoder.
Figure 2A:
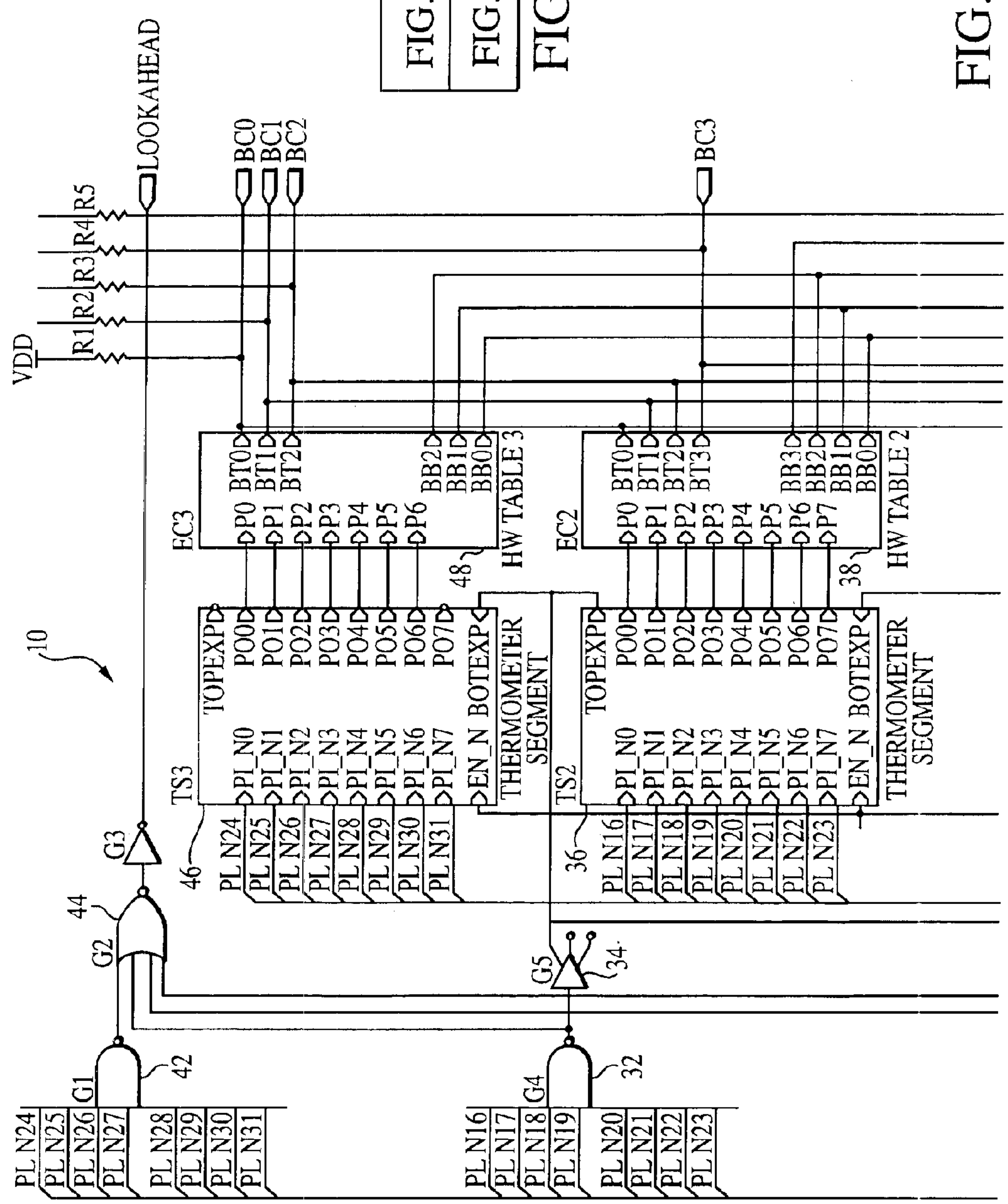
FIG. 2 is a circuit diagram of a thermometer priority encoder according to a first embodiment of the present invention.
Figure 2B:
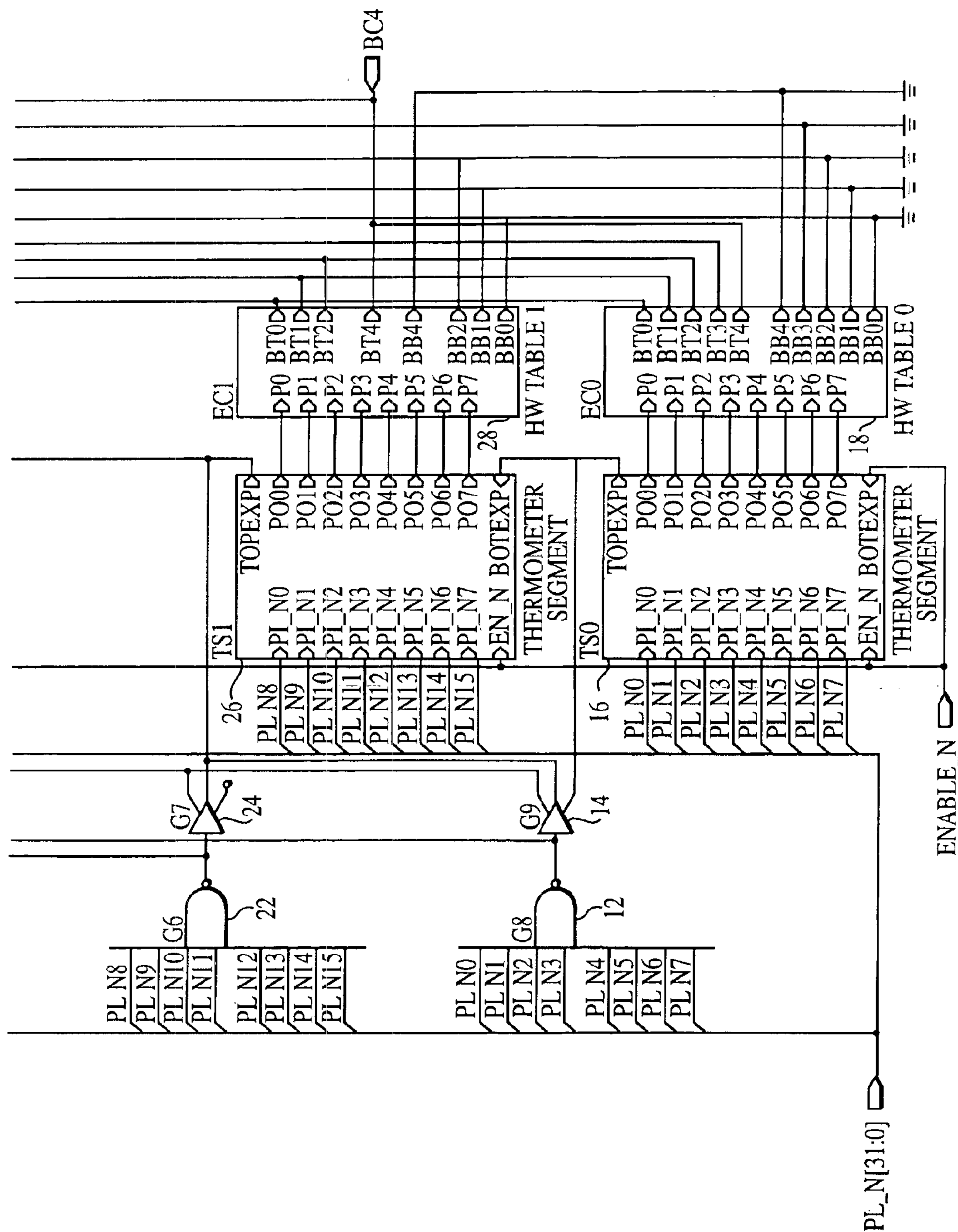

Referring initially to FIG. 2, a block diagram of an exemplary 32-input priority encoder 10 according to the present invention is shown. The portion of priority encoder 10 shown in FIG. 2 is made up of four parallel sections, each of the four sections handling eight inputs for a total of 32 inputs overall. The eight highest priority match lines are handled by a first section made up of an eight-input NAND gate 12, followed by an activity detector 14 which provides a look-ahead capability, a "thermometer" segment 16, and an address table 18.

The next highest priority set of eight match lines is handled by a second section made up of eight-input NAND gate 22, followed by a match detector 24, a "thermometer" segment 26, and an address table 28. Similarly, a third section includes eight-input NAND gate 32, followed by a match detector 34, a "thermometer" segment 36, and an address table 38. The lowest priority section includes eight-input NAND gate 42, followed by a match detector 44, a "thermometer" segment 46, and an address table 48.

Figure 3:
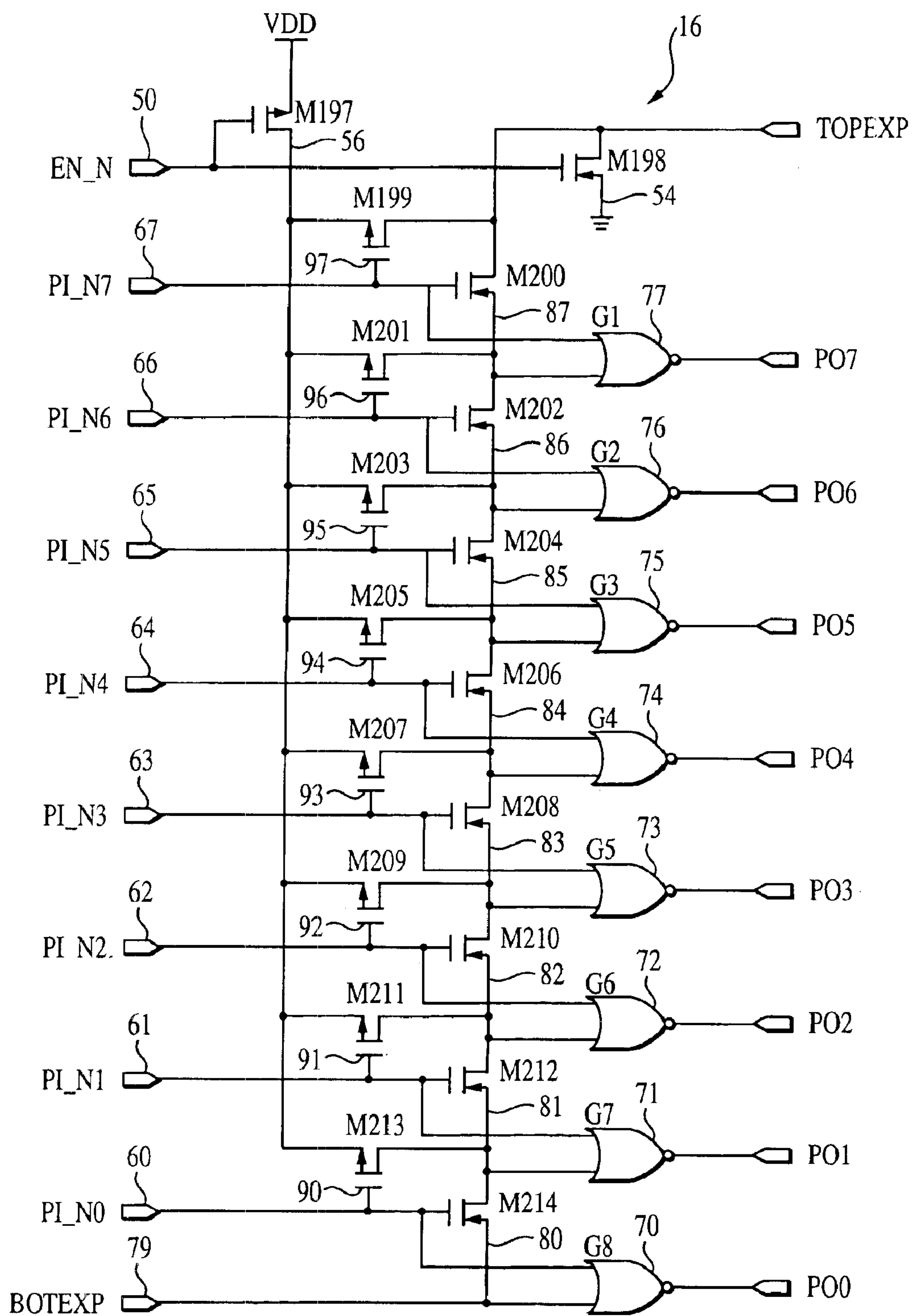
FIG. 3 is a circuit diagram of a thermometer segment of the priority encoder of FIG. 2.

Thermometer segment 16 of the highest priority section at the bottom of FIG. 2 is shown in greater detail in FIG. 3. Operation of the thermometer segment is controlled by the EN_N input 50. When EN_N is HIGH, the thermometer segment 16 is disabled, and the TOPEXP output 52 is at ground potential by way of n-channel transistor 54 which is on. P channel transistor 56 is off. A low on EN_N 50 enables the thermometer segment by supplying $V_{DD}$ to the segment through p-channel transistor 56 and turning off transistor 54.

The thermometer segments also are enabled by a signal on BOTEXP, which in the highest priority segment 16 is coupled to EN_N 50. In the remaining, lower priority segments, BOTEXP is coupled to TOPEXP from the previous segment, whereby a look-ahead signal is propagated from one segment to the next, as explained further below.

Thermometer segment 16 has eight data input lines 60–67 respectively connected to eight NOR gates 70–77, as shown in FIG. 3. Each of the input lines is normally high. A low signal on any input line indicates that a match has been detected in the CAM array for that address associate with the input line.

In addition to the input signal 60 which is supplied on one input, highest priority NOR gate 70 receives a signal on a second input from BOTEXP input 79. The BOTEXP input 79 is also provided to transistor 80, an n-channel transistor controlled by input 60. Transistor 80 supplies BOTEXP signal 79 to NOR gate 71. Input signal 60 also is supplied to the other input of NOR gate 70. A p-channel pass transistor 90 also is controlled by input 60.

Each of the remaining NOR gates 71–77 is arranged in similar fashion to receive an input signal from its respective input line 61–67 on one side, and either a $V_{DD}$ signal by way of respective pass transistors 91–97, or a BOTEXP signal by way of transistors 81–87.

Operation of thermometer circuit 16 will now be explained in connection with FIG. 3. Circuit 16 is arranged such that only the highest priority input line having a match will produce a HIGH signal on its associated NOR gate 70–77. In an enabled state, circuit 16 has a low signal provided on input 50. Consequently, p-channel transistor 56 is ON supplying power to p-channel transistors 90–97. If HIGH signals are provided on each of the input lines 60–67, indicating no match, a HIGH signal is provided directly on each of the upper inputs on NOR gates 70–79. In addition, each of the p-channel pass transistors 90–97 is OFF. Also, each of the n-channel transistors 80–87 is ON such that the LOW signal provided on BOTEXP input 79 is provided on each of the lower inputs of NOR gates 70–79. Thus, each of the NOR gates 70–79 has a HIGH and a LOW input, resulting in a LOW output. When all NOR gates 70–79 have a low output, this indicates that no priority match has been detected.

If a LOW signal, indicating a match, is provided, for example, on input line 62, then the upper input of NOR gate 72 goes low. A LOW signal continues to be supplied to the lower input of NOR gate 72, since transistors 80 and 81 remain ON by HIGH signals on inputs 60 and 61. In this state, NOR gate 72 generates a HIGH output to be passed on to address decoder 18 described further below. The LOW signal on input 62 turns OFF n-channel transistor 82. In addition, p-channel pass transistor 92 is switched ON, whereby $V_{DD}$ is supplied to the lower input of NOR gate 73, and also is supplied to transistor 83 which turns OFF. Consequently, each of the NOR gates 74–77 has a lower input which is now HIGH and continues to output a LOW signal, along with gates 70 and 71.

If a second LOW input signal indicating another match is received, for example, on input line 61, while line 62 also has a low input indicating a match, then transistor 91 is turned ON, thereby supplying $V_{DD}$ on the lower input of NOR gate 72 so that NOR gate 72 has a low output. The LOW signal on line 62 is applied to the upper input of NOR gate 71. Accordingly, only NOR gate 71 has two LOW inputs, and so provides a unique HIGH output while all other NOR gates 70, 72–77 provide a LOW input. Thus, even when two or more matches are provided to the thermometer circuit 16, only the input having the highest priority (lowest location in FIG. 3) indicates a match for address decoding.

The other, lower-priority thermometer segments 26, 36, and 46 of FIG. 2 operate in the same manner as thermometer segment 16 described above, with the BOTEXP input of each segment being connected by the TOPEXP output of each lower segment. The BOTEXP input of lowest segment 16 having the highest segment priority is connected to signal line ENABLE_N which is LOW during operation of the FIG. 2 priority encoder.

Referring again to FIG. 2, a 32 input thermometer priority encoder is shown which employs four thermometer segments 16, 26, 36, 46. As the thermometer chain gets longer with an increasing number of segments to accommodate larger numbers of match inputs, propagation times through the larger number of serially-connected segments can become a speed-limiting factor. Accordingly, a look ahead capability also is provided.

As shown in FIG. 2, a look ahead capability is provided by NAND logic gates 12, 22, 32 and 42 in conjunction with respective gates 14, 24, 34, and 44. If a match is detected on any of the inputs to NAND gates 12, 22, 32 and 42, a HIGH signal on the BOTEXP input of each thermometer segment having a higher priority disables the lower priority thermometer segments. For example, if a match is detected on NAND gate 22, it is not necessary to determine whether a match exists on any of the lower-priority segments, since a higher priority match already has been detected. Accordingly, a HIGH signal is provided by gate 24 to the BOTEXP pins of thermometer segments 36 and 46. As a result, these two lower-priority thermometer segments will be unable to generate a HIGH output on any of their NOR gates. Thus, each of gates 12, 22, and 32 is able to disable lower order segments, with gate 12 disabling segments 26, 36, 26, gate 22 disabling segments 36 and 46 and gate 32 disabling segment 46. Similarly, a HIGH signal is provided to a LOOKAHEAD output pin in response to any NAND gates 12, 22, 32, and 42 detecting a match to disable any additional priority encoder segments having a lower priority than that of segment 46.

Once a unique match is found by the priority encoder, an address location for the match is determined using an address table, for example. Referring to FIGS. 4–7, exemplary embodiments of address tables 18, 28, 38, and 48 which are respectively coupled to segments 14, 26, 36, 46 of FIG. 2 are shown. Table 18, shown in FIG. 4, codes the binary address locations 00000–00111. The remaining address tables 28, 38, 48 shown in FIGS. 5–7 code other addresses. Once the highest priority match produces a unique HIGH output from the thermometer segments 16, 26, 36, and 46, a corresponding address for the signal is decoded according to the hard wired logic of the appropriate table.

Figure 4:
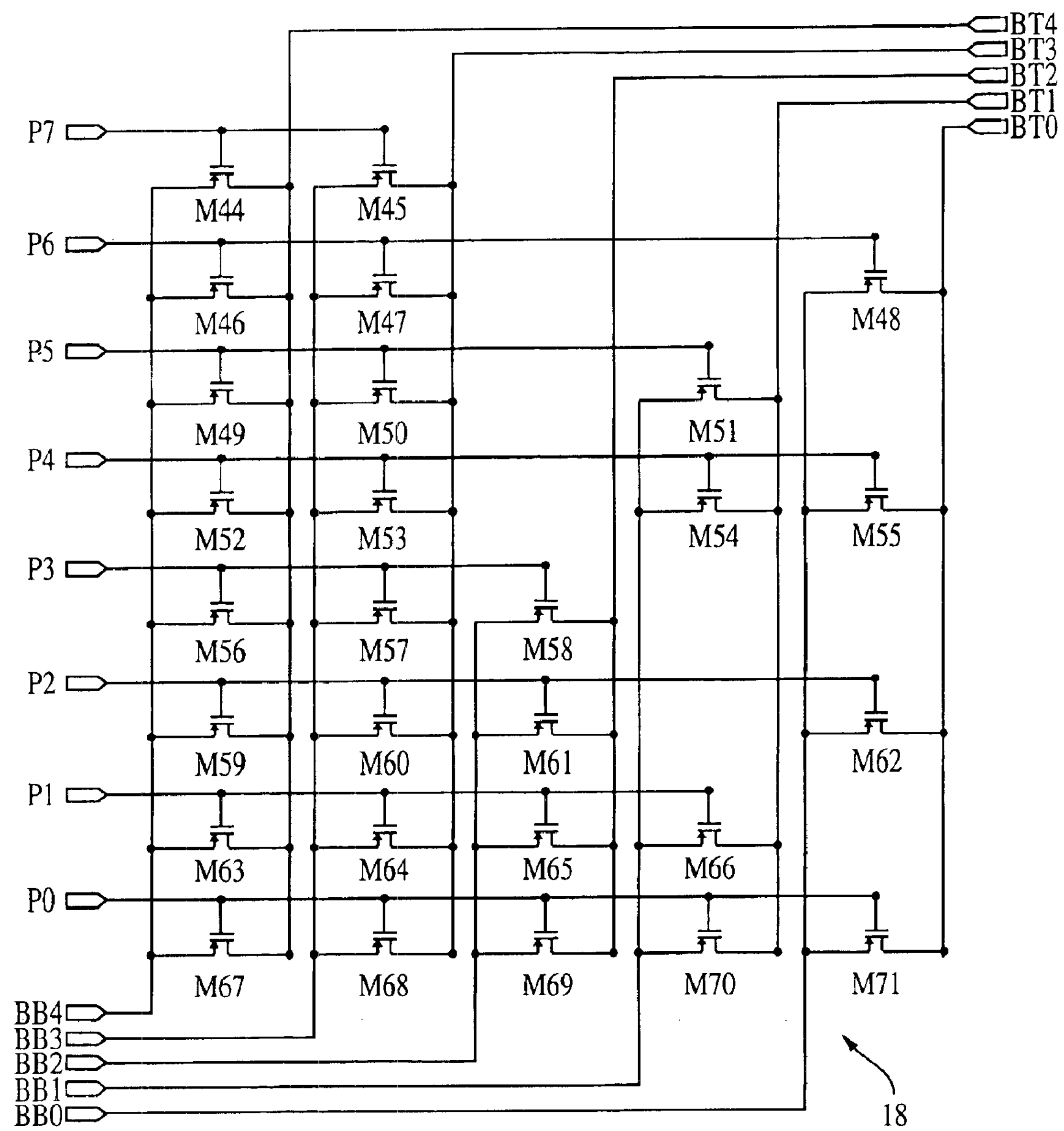
FIG. 4 is a circuit diagram of a hard wired highest priority address table employed in FIG. 2.
Figure 5:
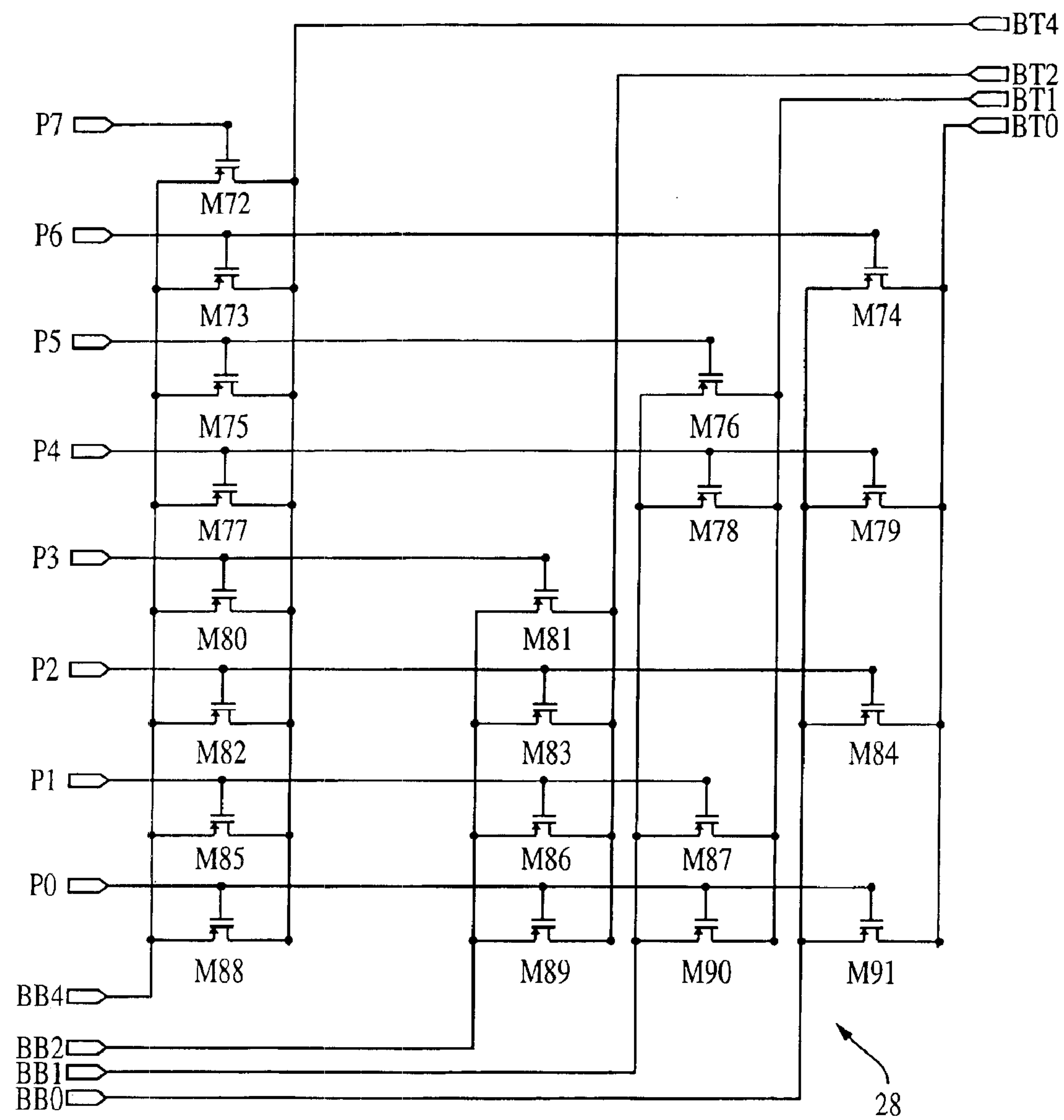
FIG. 5 is a circuit diagram of a hard wired second-highest priority address table employed in FIG. 2.
Figure 6:
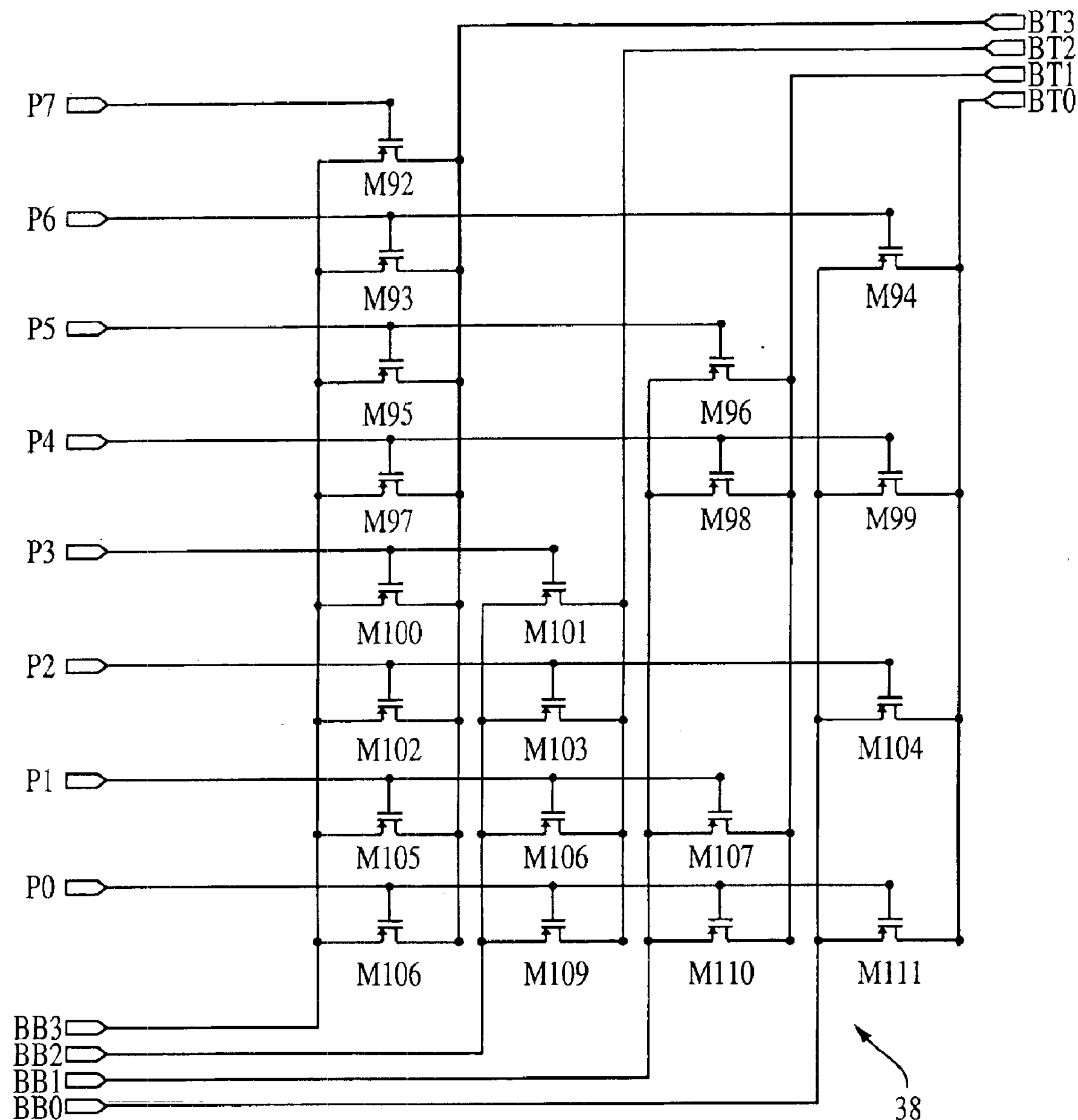
FIG. 6 is a circuit diagram of hard wired third-highest priority address table employed in FIG. 2.
Figure 7:
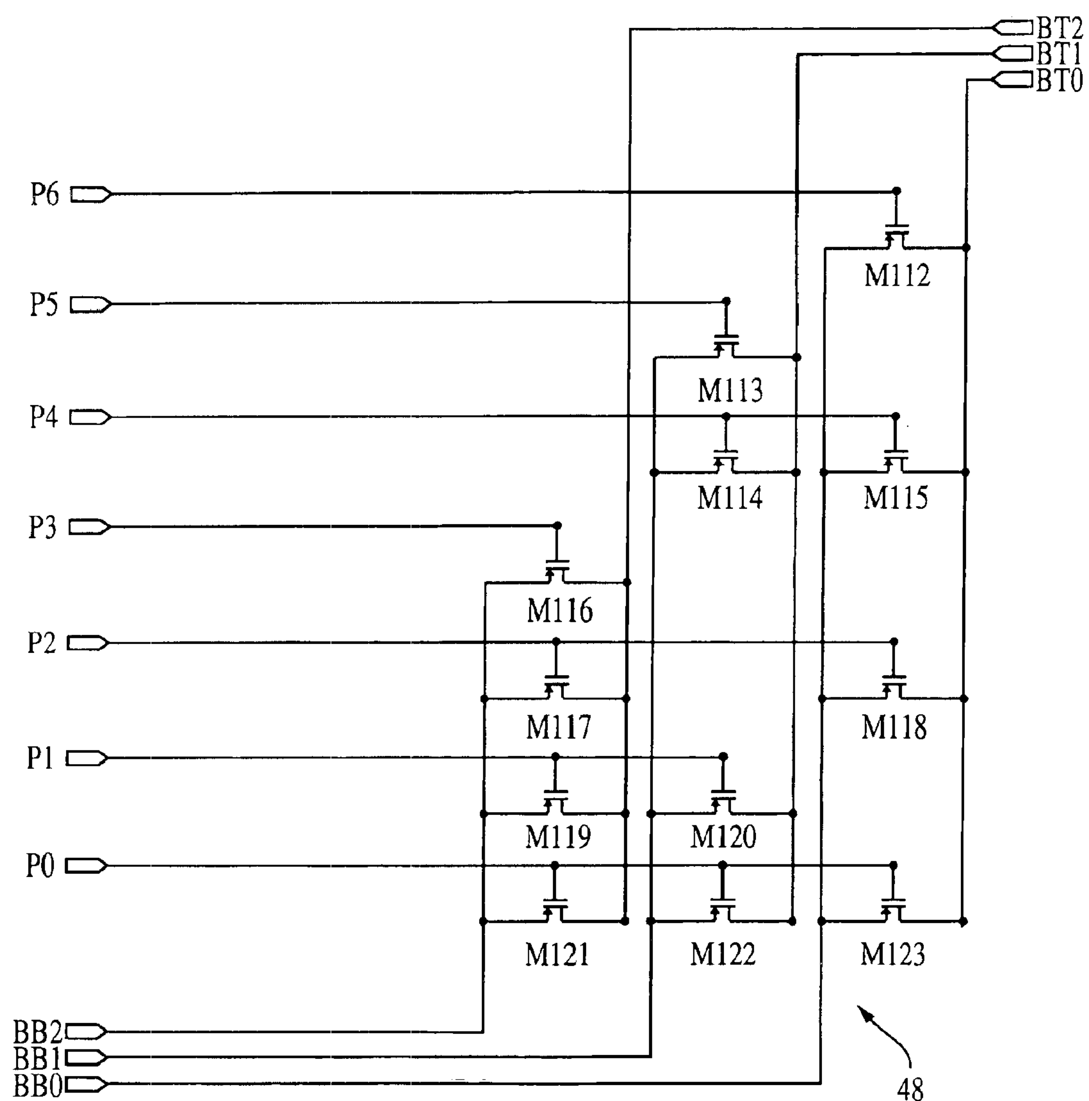
FIG. 7 is a circuit diagram of a hard wired lowest priority address table employed in FIG. 2.

An operation of the address table 18 will now be described. Tables 28, 38, 49 operate using similar principles. As shown in FIGS. 2 and 4, inputs BBO, BB1, BB2, BB3 and BB4 are grounded. Accordingly, when a HIGH signal appears on any one of inputs PO . . . P7 from an associated thermometer signal, e.g., P2, it will turn on N channel transistors M59, M60, M61, M62 providing a HIGH signal on output terminal BT4, BT3, BT2, and BT0, thus providing an address for the priority match.

As shown in FIGS. 4–7, the location of transistors in the address table provides for address coding of the segment outputs.

Figure 8:
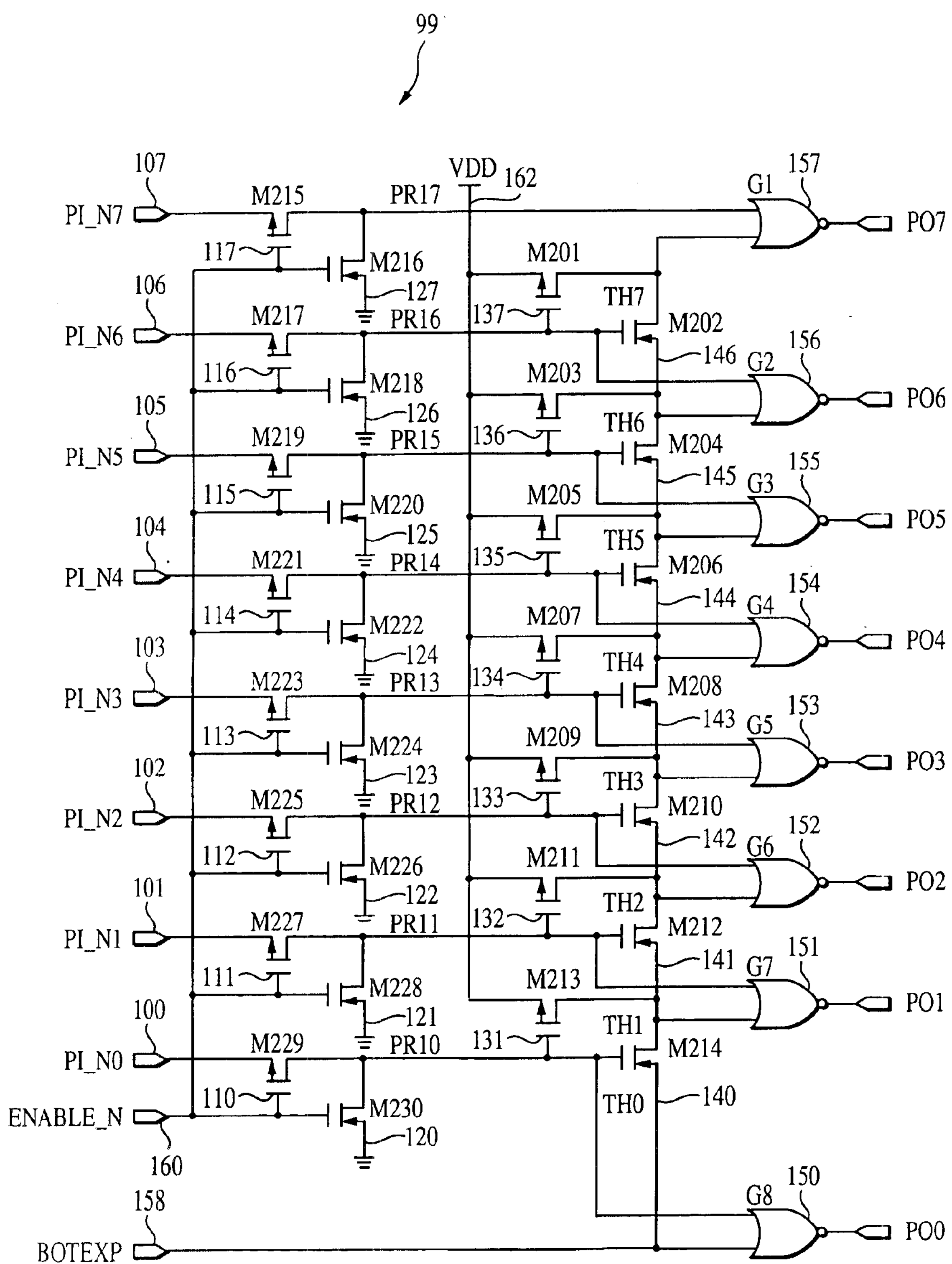
FIG. 8 is a circuit diagram of a thermometer priority encoder circuit according to a second embodiment of the present invention.

Referring to FIG. 8, a priority encoder according to a second embodiment of the invention is shown. Thermometer segment 99 utilizes an additional set of transistors to create a dynamic thermometer segment which propagates a LOW signal to indicate a priority match, rather than a HIGH signal. Thermometer segment 99 propagates a match detect signal more rapidly than thermometer segment, e.g., 16, which propagates a HIGH signal.

As shown in FIG. 8, thermometer segment 99 includes input lines 100–107, p-channel pass transistors 110–117, n-channel transistors 120–127, p-channel pass transistors 131–137, and n-channel transistors 140–146. The match input data is supplied on lines 100–107, and the highest priority match is provided by the outputs of NOR gates 150–157. A cascade capability is provided by BOTEXP input 158 from a higher priority segment. For the highest priority segment, BOTEXP is LOW. An ENABLE_N input 160 and a $V_{DD}$ input 162 also are provided.

Thermometer segment 99 operation will be described. Similar to the operation of thermometer segment 16 explained in connection with FIG. 3 above, dynamic thermometer segment 99 is arranged such that only the highest priority input line having a match will produce a HIGH signal on its associated NOR gate.

Initially, each of the match fines 100–107 sees a HIGH input, indicating that no match is found. A LOW signal is provided to ENABLE_N input 160. Consequently, p-channel transistors 110–117 are ON, and n-channel transistors 120–127 are OFF, such that each of the HIGH match line inputs is supplied to an upper input of NOR gates 150–157. In addition, n-channel transistors 140–146 are ON, such that a LOW provided on BOTEXP input 158 is seen by the lower input of each of the NOR gates 150–157. Thus, NOR gates 150–157 each have a HIGH and a LOW input, resulting in all having a LOW output.

A LOW input signal indicating a match provided on input line 102, for example, is passed by transistor 112 to NOR gate 152. A LOW signal continues to be supplied to the lower input of NOR gate 152, which thus generates a HIGH output to be supplied to an address decoder, as described further below. In addition, pass transistor 133 is switched ON, whereby $V_{DD}$ is supplied to the lower input of NOR gate 153, and also is supplied to each of the NOR gates 154–157 by n-channel transistors 144–146. Consequently, each of the NOR gates 153–157 continues to output a LOW signal, along with gates 150 and 151.

If a second LOW input signal indicating another match is received on input line 101, for example, transistor 111 passes the LOW to the upper input of NOR gate 151, and transistor 132 is turned ON, thereby supplying $V_{DD}$ on the lower input of NOR gate 152. Accordingly, only NOR gate 151 has two LOW inputs, and so provides a unique HIGH output. Thus, even when two or more matches are provided to the thermometer segment 99, only the input having the highest priority is selected for address decoding.

Figures 9, 9A, 9B:
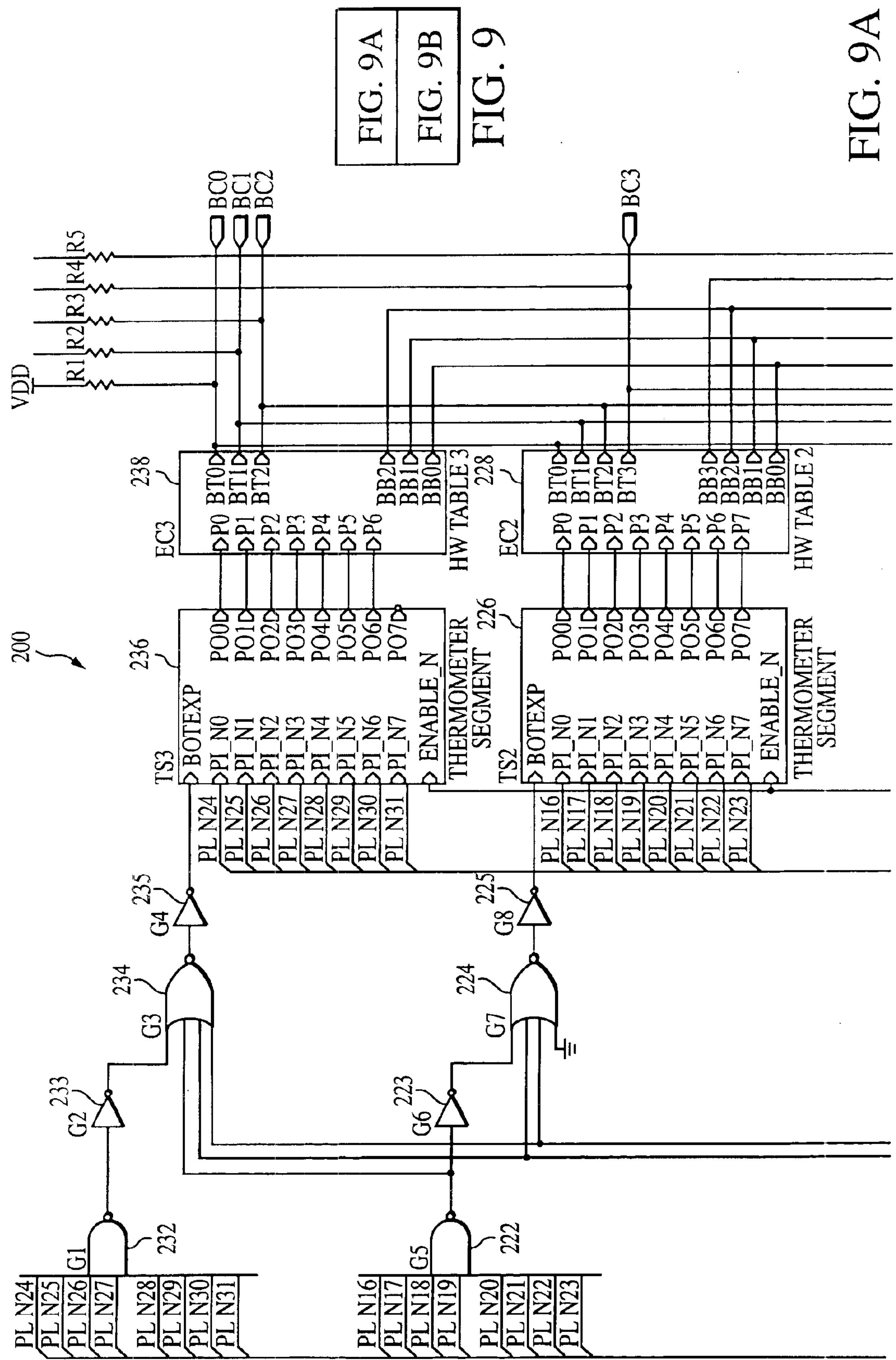
FIG. 9 is a circuit diagram of a 32 input priority encoder which uses the FIG. 8 circuit.
Figure 9B:
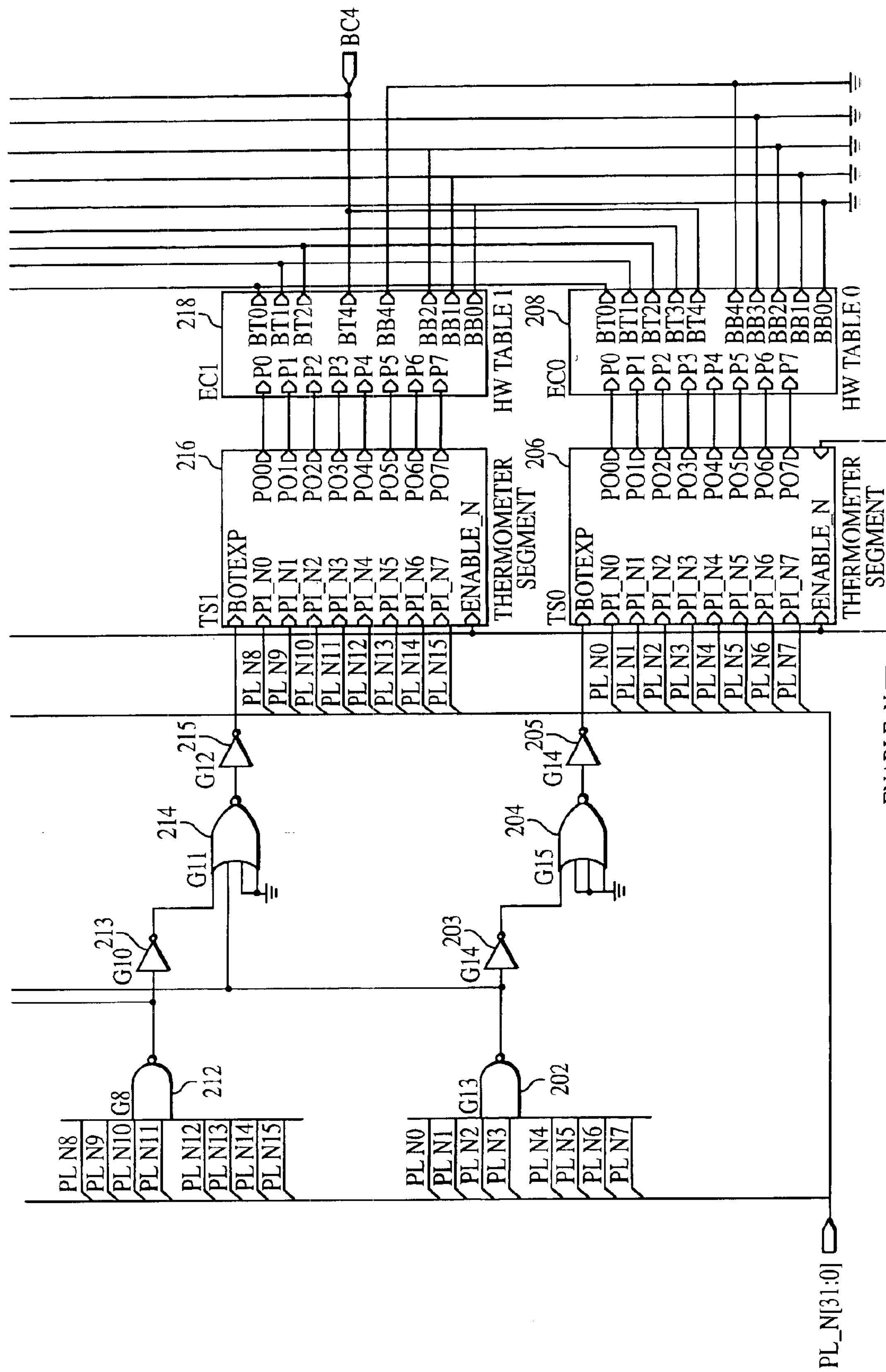

FIG. 9 is a circuit diagram of an exemplary 32-input priority encoder 200 utilizing the dynamic thermometer section 99 according to the present invention for each of priority segments 206, 216, 226, and 236. Similar to encoder 10 shown in FIG. 2, the portion of priority encoder 200 shown in FIG. 9 is made up of four parallel sections, each of the four sections handling eight inputs for a total of 32 inputs overall.

FIG. 9 encoder 200 also has look ahead logic circuitry in the form of NAND gates 202, 212, 222 and 232, which cooperate with gates 203–205, 213–215, 223–225 and 233–235. The eight highest priority match lines are handled by a first section made up of eight-input NAND gate 202, followed by a NOT gate 203, a NOR gate 204, and another NOT gate 205. The first section also includes "thermometer" segment 206, having the FIG. 8 construction, and a hard-wired address table 208.

The next highest priority set of eight match lines is handled by a second section made up of eight-input NAND gate 212, a NOT gate 213, a NOR gate 214, and another NOT gate 215. The second section also includes "thermometer" segment 216, and a hard-wired address table 218. Similarly, a third section handles the eight match lines having the next highest priority, and includes eight-input NAND gate 232, followed by a NOT gate 233, a NOR gate 234, and another NOT gate 235. The third section also includes "thermometer" segment 236, and a hard-wired address table 238. The lowest priority section includes eight-input NAND gate 242, followed by a NOT gate 243, a NOR gate 244, and another NOT gate 245. The first section also includes "thermometer" segment 246, and a hard-wired address table 248.

As noted above, when the thermometer chain gets longer, propagation times can become a limiting factor. Accordingly, FIG. 9 provides a look ahead capability. Each of the thermometer segments 206, 216, 226, and 236 will operate only when a LOW signal is provided on the BOTEXP input, as described above in connection with exemplary dynamic thermometer segment 99.

If a match is detected on any of the highest priority inputs to NAND gate 202, for example, a HIGH signal is provided to NOT gate 203, and directly to NOR gates 214, 224, and 234. As a result, a LOW signal is provided to NOR gate 204, while NOR gates 214, 224, and 234 see a HIGH signal. NOR gate 204 sees GROUND at all of its other inputs, so a HIGH signal is provided to NOT gate 205, which supplies an operational LOW signal on the BOTEXP input thermometer segment 206. The HIGH signal supplied to NOR gates 214, 224, and 234 results in a LOW signal at NOT gates 215, 225, and 235, respectively, such that lower priority thermometer circuits 216, 226, and 236 are rendered inoperative by a HIGH signal on their respective BOTEXP inputs.

Figure 10:
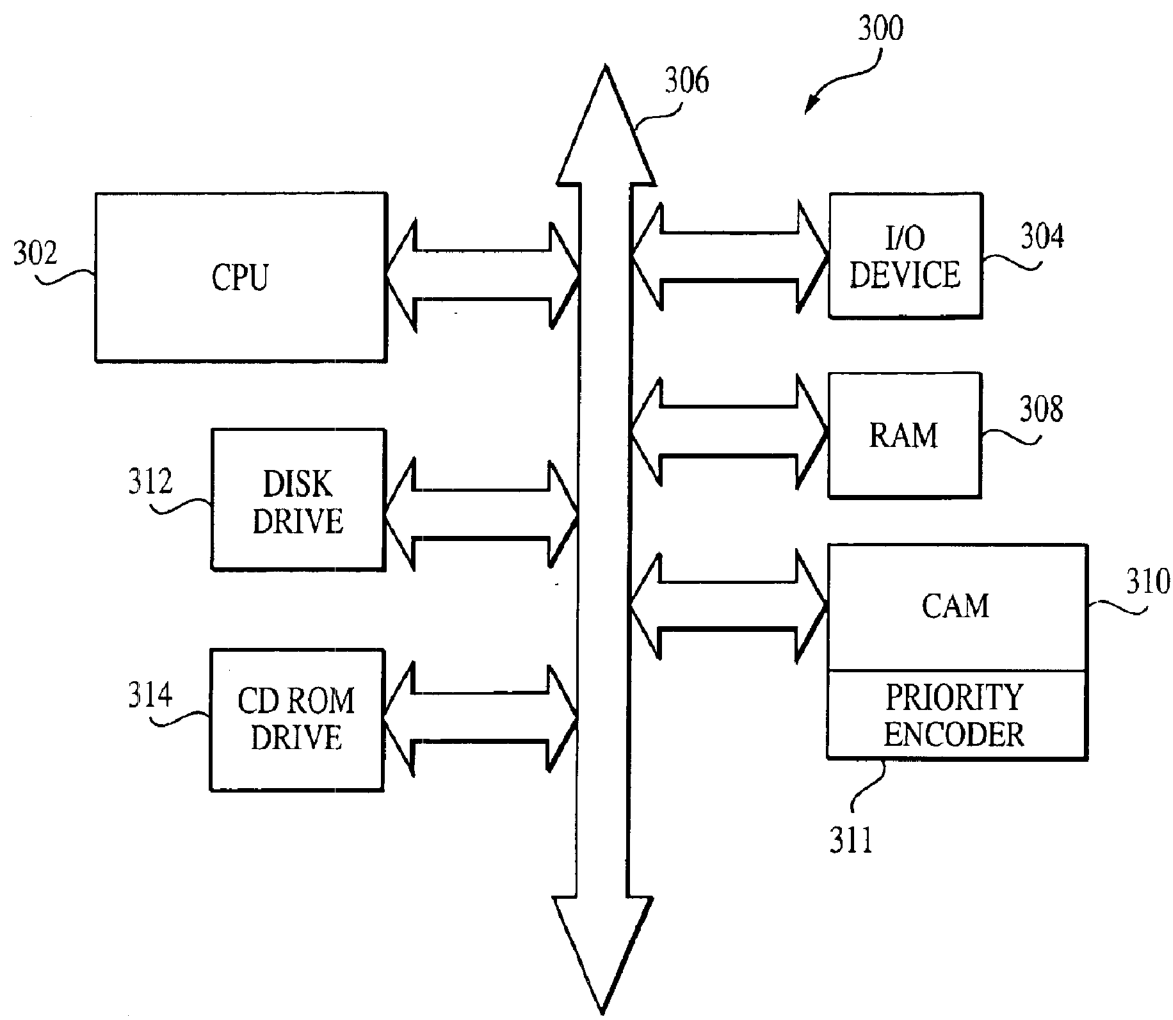
FIG. 10 is a block diagram of a microprocessor-based system which includes a CAM utilizing a priority encoder according to the present invention.

Referring to FIG. 10, a processor system 300 is represented which used a CAM 310 employing a priority encoder 311 according to the present invention. Processor system 300 generally comprises a central processing unit (CPU) 302, such as a microprocessor, that communicates with one or more input/output (I/O) devices 304 over a bus 306. The processor system 300 also includes random access memory (RAM) 308. One or more CAM devices 310 also communicate with CPU 302, CAM 310 utilizing a priority encoder 311 according to the present invention. In the case of a computer implementation for accessing a database, for example, the system may include peripheral devices such as a floppy disk drive 312 and a compact disk (CD) ROM drive 314 which also communicate with CPU 302 over the bus 306.

Figure 11:
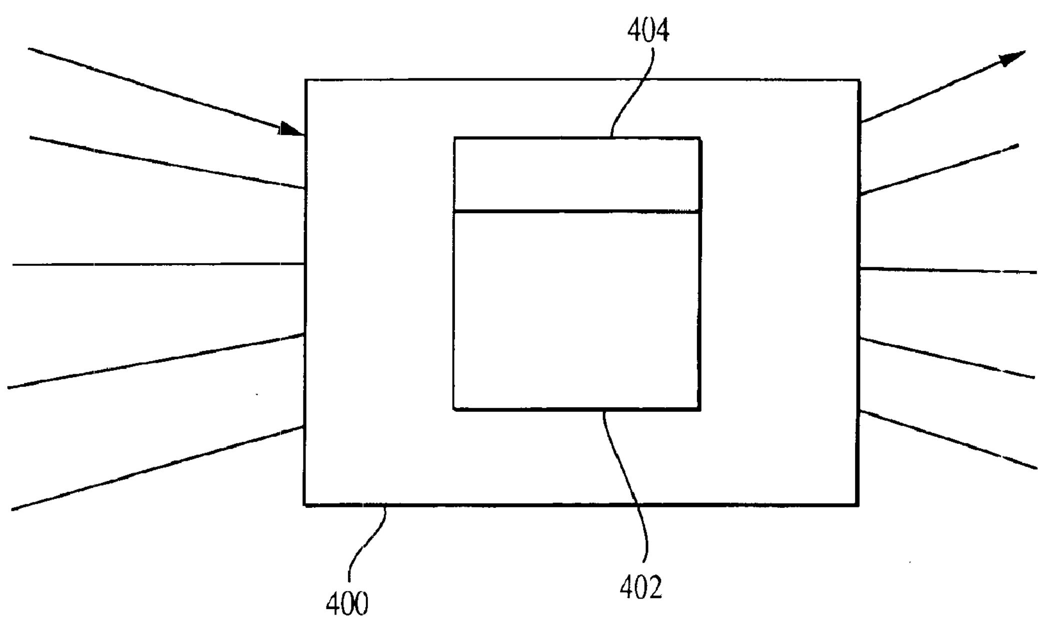
FIG. 11 is a block diagram of a router which includes a CAM utilizing a priority encoder according to the present invention.

Referring to FIG. 11, a simplified block diagram is shown of a router 400 as may be used in a communications network, such as, e.g., part of the Internet backbone. The router 400 contains a plurality of input lines and a plurality of output lines. When data is transmitted from one location to another, it is sent in a form known as a packet. Oftentimes, prior to the packet reaching its final destination, that packet is first received by a router, or some other device. The router 400 then decodes that part of the data identifying the ultimate destination and decides which output line and what forwarding instructions are required for the packet. Router 400 contains a semiconductor memory chip containing a CAM array 402 which utilizes a priority encoder 404 according to the present invention.

The present invention provides an apparatus and method for utilizing a priority encoder to code address location information derived from a CAM. While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed is:

1. A priority encoder comprising:

a plurality of logic gates, each logic gate having a first input and a second input;

a plurality of input lines arranged sequentially by priority, each of the plurality of input lines being connected to the first input of a respective one of the plurality of logic gates; and a plurality of transistor circuits respectively coupled to the second input of each logic gate and to a respective one of the plurality of input lines, each transistor circuit operating such that when a priority match is indicated on an input line to which the transistor circuit is coupled, the transistor circuit will cause the respective logic gate to indicate a match detection unless a higher priority input line is also indicating a match.

2. A priority encoder as in claim 1, wherein the transistor circuit comprises:

a first transistor which is only on when no match is indicated on an associated input line, the first transistor providing a first logic level to a second input of a logic gate associated with the next lowest priority input line, and a second transistor which is only on when a match is indicated on the associated input line to provide a second logic level to the second input of the logic gate associated with the next lowest input line.

3. The thermometer circuit of claim 2, wherein the logic gates provide a NOR function, the circuit further comprising a voltage source controlled by each second transistor for supplying a logic level high to the second input of the logic gate associated with the next lowest priority input line.

4. The thermometer circuit of claim 3, further comprising an enable input controlling application of the voltage source to the second transistors.

5. The priority encoder of claim 1, wherein the transistor circuit comprises:

a first transistor which is on when an associated input line has a first logic level and off when the associated input line has a second logic level;

a second transistor which is off when an the associated input line has the first logic level and on when the associated input line has the second logic level;

the first and second transistors being arranged with each other and with other transistor circuits such that when a match is indicated on the associated input line, one of the inputs of the lower priority logic gates is set to a voltage which prevents the lower priority gates from indicating a priority match.

6. A thermometer circuit for a priority encoder, the thermometer circuit comprising:

at least one thermometer segment including a plurality of parallel, interconnected match line recognition circuits arranged in order of priority, each match line recognition circuit including a match line input, a logic gate, and a first transistor and a second transistor connected to a first input of the logic gate and controlled by the match line input, such that a match signal provided on one of the match line inputs generates a match-indicating output on the associated logic gate, unless a match signal is provided on a higher priority match line input.

7. The thermometer circuit of claim 6, further comprising a plurality of thermometer segments arranged in order of priority, the thermometer segments being commonly connected to a look-ahead signal such that each lower priority segment is disabled if a match is detected on a higher priority segment.

8. A priority encoder comprising a plurality of cascaded thermometer segments, each thermometer segment including:

a plurality of logic gates, each logic gate having a first input and a second input;

a plurality of input lines arranged sequentially by priority, each input line being connected to the first input of a respective one of the plurality of logic gates; and a plurality of transistor circuits respectively coupled to each logic gate and to a respective input line, each transistor circuit operating such that when a priority match is indicated on an input line to which the transistor circuit is coupled, the transistor circuit will cause the respective logic gate to indicate a match detection unless a higher priority input line is also indicating a match.

9. A priority encoder for a content addressable memory device, the priority encoder comprising:

a plurality of priority encoder segments arranged in a hierarchical order, each priority segment determining priority of one of a plurality of input lines thereto which are arranged in hierarchical order, each higher priority segment disabling all lower priority segments when detecting a priority at at least one of the inputted lines thereto.

10. A priority encoder as in claim 9, wherein each priority encoder segment comprise:

a plurality of logic gates arranged in priority hierarchy and having one input connected to a respective input line to receive one of a first logic signal indicating no match and a second logic signal indicating a match; and a transistor circuit coupled to the input lines and to a second input of each of the plurality of logic gates, the transistor circuit operating to apply logic signals to the second inputs of the logic gates in response to logic signals on the input line in a manner such that when a first input line contains a signal indicating a match and there is no higher priority input lines indicating match, the output gate connected to the first input line indicates a match.

11. A priority encoder as claimed in claim 10, further comprising a plurality of address indicating circuits respectively associated with the encoder segments, each address indicating circuit providing an address associated with an output gate indicating a match.

12. A priority encoder as in claim 9, further comprising a look ahead logic circuit for disabling lower order priority encoder segments when a match is detected at a higher order priority encoder segment.

13. A microprocessor based system comprising:

a microprocessor; and a CAM system including:

a content addressable memory; and a priority encoder including a plurality of logic gates, each logic gate having a first input and a second input; a plurality of input lines arranged sequentially by priority, each input line being connected to the first input of a respective one of the plurality of logic gates; and a plurality of transistor circuits respectively coupled to each logic gate and to a respective input line, each transistor circuit operates such that when a priority match is indicated on an input line to which the transistor circuit is coupled, the transistor circuit will cause the respective logic gate to indicate a match detection unless a higher priority input line is also indicating a match.

14. The microprocessor based system of claim 13, further wherein the CAM system further comprises an address decoder.

15. A method of coding address information derived from a content addressable memory (CAM) using a priority encoder, the method comprising the steps of:

supplying a first signal on each of a plurality of input match lines of the priority encoder, the input match lines being arranged sequentially by priority, each input line being connected to a first input of a respective logic gate;

providing a second signal to a second input of each respective logic gate;

providing a look-ahead signal to each of a first transistor which is controlled to be on when no match is indicated on a respective input line, and providing a voltage signal to each of a second transistor controlled by the first signal to be on when a match is indicated on a respective input line;

whereby, when the match information from the CAM includes a low signal indicating a line with a match, and no higher priority line indicates a match, both inputs of the corresponding logic gate are low, resulting in a high output from the corresponding logic gate.

16. The method of claim 15, further comprising the step of passing the high output from the corresponding logic gate to an address table.

17. A thermometer circuit for a priority encoder, the thermometer circuit comprising a plurality of transistor logic arrangements coupled to prioritized NOR gates, such that only a highest priority matching input of several matching inputs provided to the transistor logic arrangement is forwarded by a respective one of the NOR gates to an address table for decoding the address of the highest priority match.

18. A router comprising:

a content addressable memory (CAM); and a priority encoder including a plurality of logic gates, each logic gate having a first input and a second input; a plurality of input lines arranged sequentially by priority, each input line being connected to the first input of a respective one of the plurality of logic gates; and a plurality of transistor circuits respectively coupled to each logic gate and to a respective input line, each transistor circuit operates such that when a priority match is indicated on an input line to which the transistor circuit is coupled, and no higher priority input line indicates a match, the transistor circuit will cause the respective logic gate to indicate a match detection.

19. A priority encoder for priority encoding match lines of a content addressable memory, the encoder comprising:

a plurality of logic gates arranged in a priority order, each logic gate having a first input and a second input, and an output;

a plurality of match input lines respectively coupled to the first inputs of the logic gates;

a plurality of first switching devices each coupled to pass a signal from a second input of a higher priority logic gate of a priority adjacent pair of logic gates to a second input of a lower priority logic gate of the adjacent pair of gates, the first switching device being arranged to stop the passing of the signal to the lower priority gate of the pair in response to a match signal being present at a first input of the higher priority gate of the pair;

a plurality of second switching devices coupled to pass a voltage to the second inputs of said plurality of logic gates, the second switching devices being arranged such that for each pair of priority adjacent gates, a respective second switching device passes the voltage to the lower priority gate of the pair in response to a match signal being present at a first input of the higher priority gate of the pair.

20. A priority encoder as in claim 19, wherein the plurality of match input lines are coupled directly to the respective first inputs of the logic gates.

21. A priority encoder as in claim 19, wherein the plurality of match input lines are coupled to the respective first inputs of the logic gates through a transistor circuit, the transistor circuit being arranged to uncouple the match input lines from the first inputs of the logic gates upon detection of a disable signal provided to the transistor circuit.

22. A priority encoder as in claim 21, wherein the transistor circuit is further arranged to couple the first inputs of the logic gates to ground upon detection of the disable signal.

23. A priority encoder as in claim 19, wherein the logic gate is a NOR gate.

24. A priority encoder as in claim 19, wherein a match is indicated by a low signal received on the match line input, and the first switching device is an n-channel transistor controlled by the low signal to be off, and the second switching device is a p-channel transistor controlled by the low signal to be on.

* * * * *